United States Patent
Lim

(10) Patent No.: US 6,845,732 B2
(45) Date of Patent: Jan. 25, 2005

(54) GAS HEATING APPARATUS FOR CHEMICAL VAPOR DEPOSITION PROCESS AND SEMICONDUCTOR DEVICE FABRICATION METHOD USING SAME

(75) Inventor: You-Dong Lim, Suwon-si (KR)

(73) Assignee: Jusung Engineering Co., Ltd. (KR)

( * ) Notice: Subject to any disclaimer, the term of this patent is extended or adjusted under 35 U.S.C. 154(b) by 138 days.

(21) Appl. No.: 10/386,765

(22) Filed: Mar. 12, 2003

(65) Prior Publication Data

US 2003/0221617 A1 Dec. 4, 2003

(30) Foreign Application Priority Data

Jun. 3, 2002 (KR) .................................. 10-2002-0030999

(51) Int. Cl.⁷ ..................... C23C 16/00; C23C 16/448; F28F 1/00; F28F 1/01; F28F 1/14
(52) U.S. Cl. ................... 118/715; 118/724; 156/345.29; 156/345.37; 165/157; 165/172; 165/177; 165/181; 165/183
(58) Field of Search ............................. 118/715, 724; 156/345.29, 345.37; 165/58, 157, 172, 177, 181, 183

(56) References Cited

U.S. PATENT DOCUMENTS

| | | | | |
|---|---|---|---|---|
| 3,704,748 A | * | 12/1972 | Hapgood ................... | 165/165 |
| 3,921,712 A | * | 11/1975 | Renzi .......................... | 165/165 |
| 5,068,871 A | * | 11/1991 | Uchida et al. ............... | 373/17 |
| 5,146,869 A | * | 9/1992 | Bohannon et al. .......... | 118/724 |
| 5,279,670 A | * | 1/1994 | Watanabe et al. ........... | 118/725 |
| 5,520,742 A | * | 5/1996 | Ohkase ........................ | 118/724 |
| 6,086,677 A | * | 7/2000 | Umotoy et al. ............. | 118/715 |
| 6,332,927 B1 | * | 12/2001 | Inokuchi et al. ............ | 118/725 |
| 6,540,509 B2 | * | 4/2003 | Asano et al. ................ | 432/205 |
| 6,688,378 B2 | * | 2/2004 | O'Donnell et al. ......... | 165/109.1 |
| 6,702,004 B2 | * | 3/2004 | Stratman et al. ............ | 165/115 |
| 2002/0066409 A1 | * | 6/2002 | Brun ........................... | 118/715 |
| 2003/0084848 A1 | * | 5/2003 | Long ........................... | 118/715 |
| 2003/0221617 A1 | * | 12/2003 | Lim ............................. | 118/715 |
| 2004/0025370 A1 | * | 2/2004 | Guenther ..................... | 34/576 |

FOREIGN PATENT DOCUMENTS

| | | | |
|---|---|---|---|
| JP | 62-035521 A | * | 12/1987 |
| JP | 63-316425 A | * | 12/1988 |

* cited by examiner

Primary Examiner—Jeffrie R. Lund
(74) Attorney, Agent, or Firm—Baker & Daniels

(57) ABSTRACT

The present invention provides a gas heating apparatus that activates reaction gases for a chemical vapor deposition. The gas heating apparatus includes a chamber becoming enclosures of the gas heating apparatus; a heat insulating material 20 formed on an inner surface of the chamber so as to thermally insulate the inside of the chamber from the outside; a quartz tube having a gas inflow pipe, a gas outflow pipe, enlarged-pipe portions and abridged-pipe portion, wherein the enlarged-pipe portions and the abridged-pipe portions are alternately repeated and constitute a zigzag shape in an up-and-down direction in the chamber; a plurality of ceramic balls located inside the enlarged-pipe portions of the quartz tube; and a heater having a shape of coil spring and surrounding the zigzag shape of the quartz tube in the chamber.

12 Claims, 2 Drawing Sheets

GAS HEATING APPARATUS FOR CHEMICAL VAPOR DEPOSITION PROCESS AND SEMICONDUCTOR DEVICE FABRICATION METHOD USING SAME

This application claims the benefit of Korean Patent Application No. 2002-0030999 filed on Jun. 3, 2002 in Korea, which is hereby incorporated by reference in its entirety for all purposes as if fully set forth herein.

BACKGROUND OF THE INVENTION

1. Field of the Invention

The present invention relates to an apparatus for use in a chemical vapor deposition process and a method for fabricating a semiconductor device. And more particularly, the present invention relates to a gas heating apparatus that previously applies heat to and then activates process gases for the chemical vapor deposition.

2. Description of Related Art

The Chemical Vapor Deposition (CVD) is a process that reaction gases are introduced in a main chamber and then react with one another above a hot substrate to form a thin film, such as a $SiO_2$ insulating film, or a tungsten (W) or aluminum (Al) thin film. In order to increase the efficiency of CVD process, the reaction gases are previously heated and then activated using a gas heating apparatus. Then, such a gas heating apparatus is usually installed in a gas inlet of the main chamber where the chemical vapor deposition (CVD) is performed.

FIG. 1 is a detailed portion cross sectional and partially cutaway view of a gas heating apparatus for the chemical vapor deposition according to a related art.

In FIG. 1, the gas heating apparatus includes a quartz tube 30 that is a reaction-gas passage, a line heater 50 that contacts and surrounds the surface of the quartz tube 30, ceramic balls 40 that are contained inside the quartz tube 30, a chamber frame 10 that is packing the gas heating apparatus, a heat insulating material 20 that is formed on the inside surface of the chamber frame 10, and a coolant passage 11 that is installed in the chamber frame 10 to cool the chamber frame 10.

In the gas heating apparatus of FIG. 1, the reaction gas flows through the quartz tube 30 and then contacts with the ceramic balls 40. Therefore, the reaction gas is activated by the ceramic balls 40 that contain thermal energy generated from the line heater 50. At this point, the reaction gas is introduced in the gas heating apparatus with a high velocity, so that the quartz tube 30 is designed to have a spiral shape like a spring in order to take a sufficient time for the reaction gases to be activated. Substantially, the spiral shape of the quartz tube 30 prolongs the length of the quartz tube 30 within the gas heating apparatus. Further, in order to apply heat to the reaction gas during the reaction gas activation in the gas heating apparatus, the line heater 50 is wound around the surface of spiral-shaped quartz tube 30. And the ceramic balls 40 are located inside the spiral portion of the quartz tube 30.

However, the gas heating apparatus of FIG. 1 has some disadvantages. There is a limitation of prolonging the length of the spiral-shaped quartz tube 30 because, the gas heating apparatus of FIG. 1 becomes too large. Additionally, due to the fact that the quartz tube 30 has a small diameter, a small number of ceramic balls 40 are contained inside the quartz tube 30, and thus the reaction gas is hardly activated. Also it is difficult to embrace the line heater 50 because the line heater 50 is wound around the spiral-shaped quartz tube 30.

SUMMARY OF THE INVENTION

Accordingly, the present invention is directed to a gas heating apparatus that substantially overcomes one or more of the problems due to limitations and disadvantages of the related art.

An object of the present invention is to provide a gas heating apparatus that efficiently activates reaction gases for the chemical vapor deposition process.

An another object of the present invention is to provide a more efficient method of fabricating semiconductor devices using an inventive gas heating apparatus.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a gas heating apparatus activating reaction gases for a chemical vapor deposition includes a chamber becoming enclosures of the gas heating apparatus; a heat insulating material 20 formed on an inner surface of the chamber so as to thermally insulate the inside of the chamber from the outside; a quartz tube having a gas inflow pipe, a gas outflow pipe, enlarged-pipe portions and abridged-pipe portion, wherein the enlarged-pipe portions and the abridged-pipe portions are alternately repeated and constitute a zigzag shape in an up-and-down direction in the chamber; a plurality of ceramic balls located inside the enlarged-pipe portions of the quartz tube; and a heater having a shape of coil spring and surrounding the zigzag shape of the quartz tube in the chamber.

In accordance with the present invention, the enlarged-pipe portion are 1 to 10 times larger in diameter than the gas inflow and outflow pipes. The heater surrounds the quartz tube in a longitudinal direction and the enlarged-pipe portions of the quartz tube are located inside the coil spring-shaped heater. Each abridged-pipe portion is disposed in between the enlarged-pipe portions and connects the two enlarged-pipe portions so that the enlarged-pipe portions constitute the zigzag shape inside the coil spring-shaped heater. A diameter of the enlarged-pipe portions vary and is adjusted depending on the chemical vapor deposition process. A diameter of the abridged-pipe portion is excessively smaller than that of the enlarged-pipe portion. The diameter of the abridged-pipe portion is equal to, smaller than or larger than that of the gas inflow and outflow pipes. The enlarged-pipe portions containing the plurality of ceramic balls therein make the speed of gas current slow down so that the reaction gases contact with the ceramic ball for a sufficiently long time and receive enough thermal energy from the plurality of ceramic balls. The gas heating apparatus activating reaction gases for a chemical vapor deposition further includes a coolant passage in the chamber so that a coolant flowing through the coolant passage cools down the chamber.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment of the invention and together with the description serve to explain the principle of the invention.

In the drawings.

DETAILED DESCRIPTION OF ILLUSTRATED EMBODIMENTS

Reference will now be made in detail to illustrated embodiment of the present invention, examples of which are shown in the accompanying drawings. Wherever possible, the same reference numbers will be used throughout the drawings to refer to the same or like parts.

Figure 2:
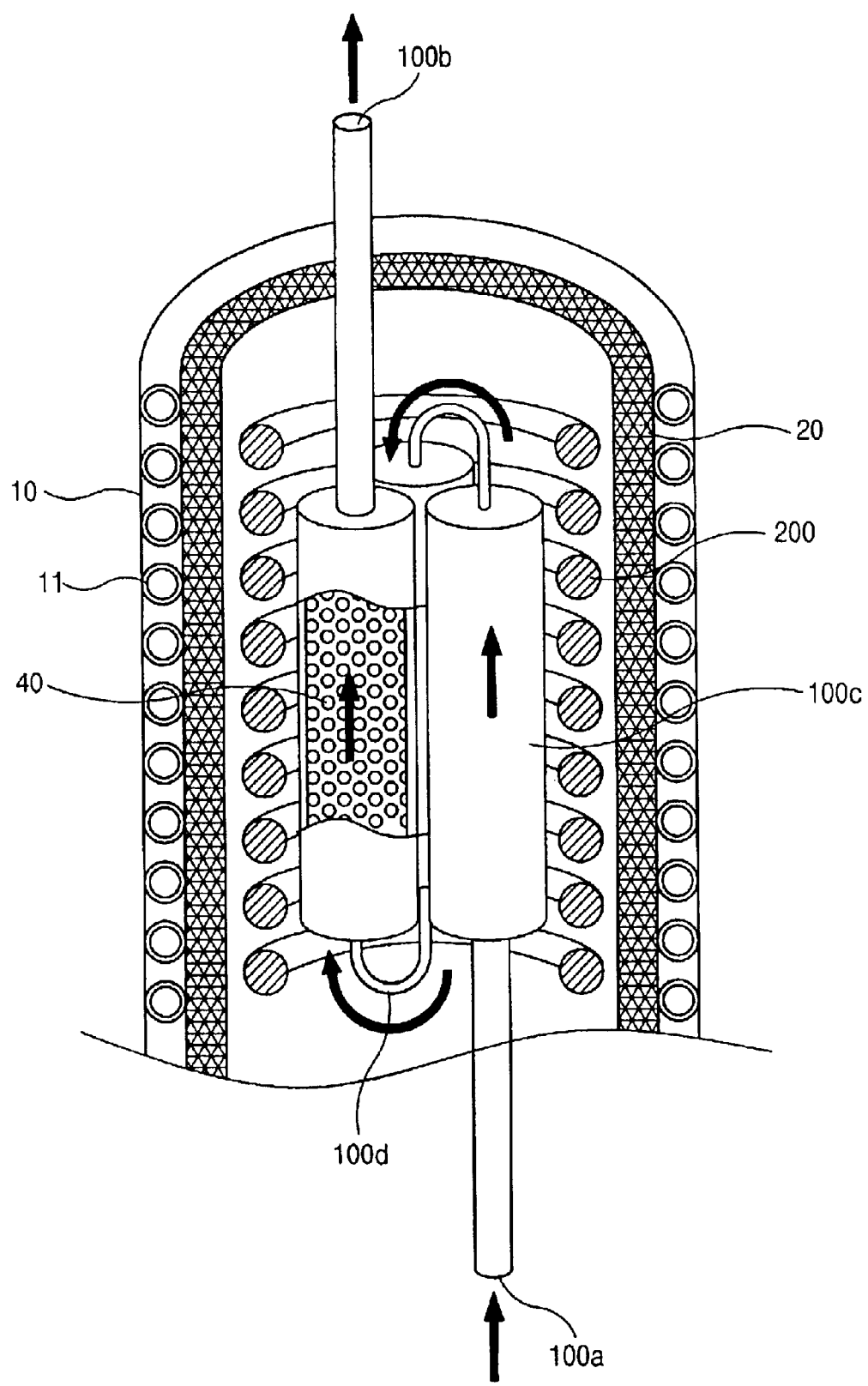
FIG. 2 is a detailed portion cross sectional and partially cutaway view of a gas heating apparatus for the chemical vapor deposition according to the present invention.

FIG. 2 is a detailed portion cross sectional and partially cutaway view of a gas heating apparatus for the chemical vapor deposition according to the present invention. The arrows shown in FIG. 2 denote the flow of reaction gas.

In FIG. 2, the gas heating apparatus of the present invention for use in a chemical vapor deposition process includes a chamber 10, a heat insulating material 20, a quartz tube 100, a plurality of ceramic balls 40, and a heater 200.

The chamber 10 is a frame that encloses the gas heating apparatus. A coolant passage Ills disposed inside the chamber wall 10 so that the coolant flows through the coolant passage 11 and then cools down the chamber 10. The heat insulating material 20 is formed on the inner surface of the chamber 10 so that it thermally insulates the inside of the chamber 10 from the outside.

The quartz tube 100 includes a gas inflow pipe 100a that is connected with a gas supplying unit (not shown), a gas outflow pipe 100b that is connected with a main chamber (not shown) where the chemical vapor deposition apparatus is conducted, enlarged-pipe portions 100c that are 1 to 10 times larger in diameter rather than the gas inflow and outflow pipes 100a and 100b, and abridged-pipe portions 100d that have an excessively smaller diameter than the enlarged-pipe portion 100c. The enlarged-pipe portions 100c and the abridged-pipe portions 100d are alternately repeated. Moreover, the quartz tube 100 has a zigzag shape in an up-and-down direction. When the reaction gas flows along the enlarged-pipe portions 100c of the quartz tube 100, the speed of gas current becomes slower due to the large diameter of the enlarged-pipe portions 100c. The diameter of the enlarged-pipe portion 100c can vary and be adjusted depending on the chemical vapor deposition process although the diameter is said above to be 1–10 times larger than the gas inflow and outflow pipes 100a and 100b. Further, each abridged-pipe portion 100d connects the two enlarged-pipe portions 100c. The diameter of the abridged-pipe portion 100d is satisfactory enough if the reaction gas is able to pass from one to another enlarged-pipe portion 100c. Therefore, it does not matter about the abridged-pipe portions 100d whether its diameter is equal to, larger than or smaller than the diameter of the gas inflow and outflow pipes 100a and 100b.

Figure 1:
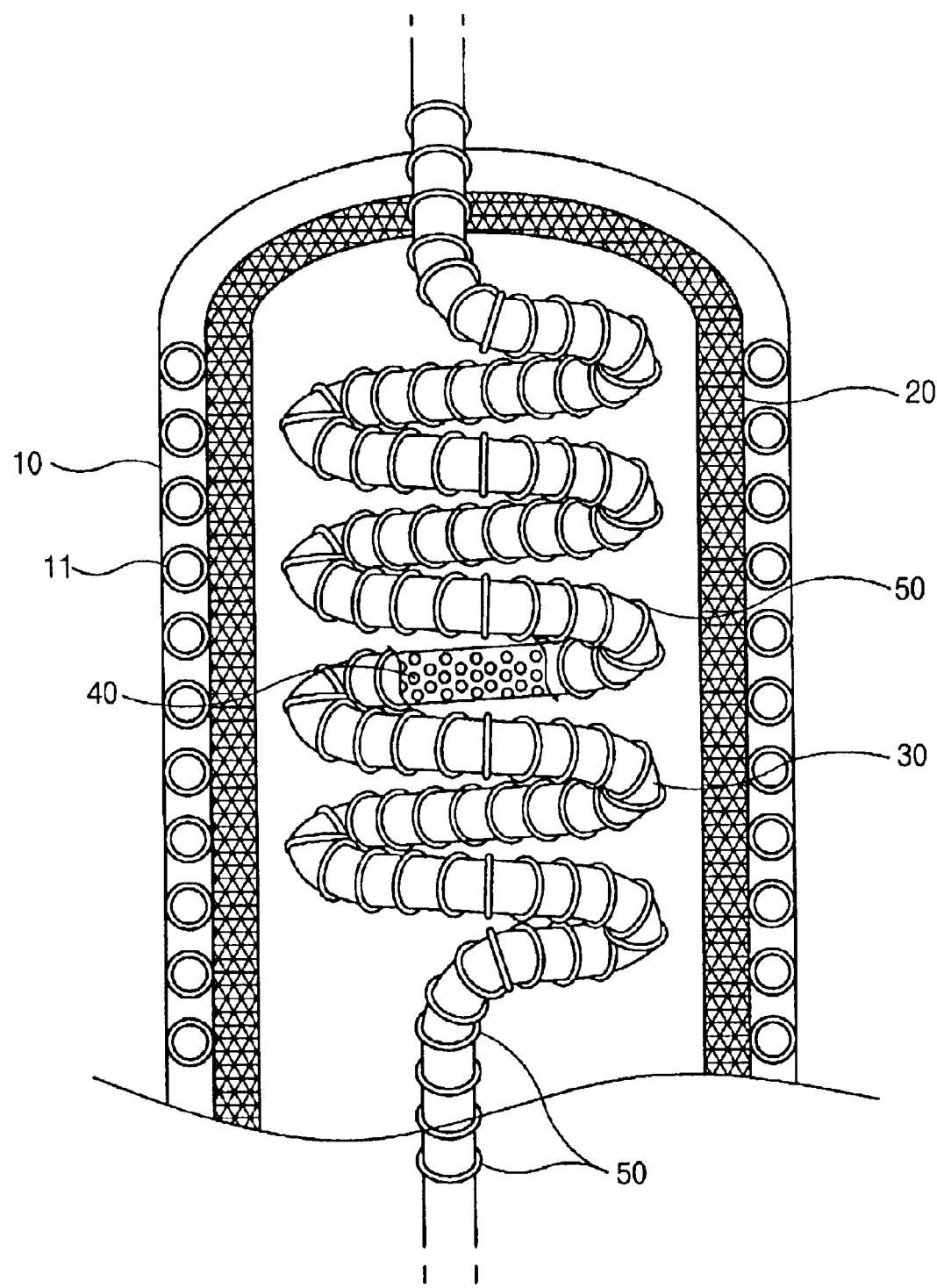
FIG. 1 is a detailed portion cross sectional and partially cutaway view of a gas heating apparatus for the chemical vapor deposition according to a related art.

The ceramic balls 40 are located only inside the enlarged-pipe portion 100c of the quartz tube 100. Therefore, it is possible that a relatively large number of ceramic balls 40 are disposed inside the quartz tube 100, as compared to the related art shown in FIG. 1. Since the speed of gas current is slowing down in the enlarged-pipe portion 100c, the reaction gas can sufficiently contact with the ceramic balls 40 for a relatively long time. And thus, the reaction gas can receive sufficient thermal energy from the ceramic balls 40 and then is easily activated for the chemical vapor deposition.

The heater 200 is disposed along the inner surface of the heat insulating material 200 and is shaped like a coil spring so that the heater 200 surrounds the enlarged-pipe portions 100c. Namely, the enlarged-pipe portions 100c are located inside the coil spring-shaped heater 200. In the present invention, since the quartz tube 100 has the zigzag shape in an up-and-down direction and the heater 200 surrounds the zigzag-shaped quartz tube 100 in a longitudinal direction, the reaction gas passing through the quartz tube 100 can receive enough thermal energy although the heater 200 does not wind around the surface of the quartz tube 100.

In the present invention, the enlarged-pipe portions 100c are disposed in a longitudinal direction as shown in FIG. 2, and the abridged-pipe portions 100d connect the enlarged-pipe portions 100c in between them. Further, the heater 200, i.e., in a shape of coil spring, particularly, surrounds the enlarged-pipe portions 100c to apply heat to the reaction gas. Accordingly, the thermal efficiency of the gas heating apparatus incredibly increases in accordance with the present invention.

The gas heating apparatus described with reference to FIG. 2 is installed in the gas inlet of the main chamber whereby the chemical vapor deposition is conducted. In a method of fabricating semiconductor devices according to the present invention, the reaction gases for the chemical vapor deposition are heated and then activated using the gas heating apparatus of FIG. 2 before they are introduced into the main chamber. Namely, the reaction gases are preliminary and previously thermal-treated by the above-mentioned gas heating apparatus according to the present invention.

According to the present invention, the gas heating apparatus having a higher thermal efficiency than the conventional art is employed to activate the reaction gases before introducing the reaction gases into the main chamber for the chemical vapor deposition. Therefore, it is possible to decrease the temperature of a main heater that heats the substrate in the main chamber. Accordingly, thermal efficiency increases throughout the semiconductor devices fabrication.

In accordance with the present invention described hereinbefore, the heating apparatus includes the quartz tube having the enlarged-pipe portions therein. The enlarged-pipe portions of the quartz tube make the gas current rate be lowered. The ceramic balls located only inside the enlarged-pipe portions make the reaction gases receive the sufficient thermal energy by way of long time contact. Thus, the reaction gases passing though the gas heating apparatus of the present invention are easily activated. Furthermore, the gas heating apparatus do not have to be large in bulk in order to sufficiently apply heat to the reaction gases because the reaction gases move slowly in the enlarged-pipe portions of the quartz tube. The reaction gases are easily activated in the method of the present invention.

The quartz tube of the present invention has a zigzag shape in an up-and-down direction, and the heater shaped like a coil spring embraces the zigzag-shaped quartz tube in the longitudinal direction. Therefore, it is easy to install the heater in the chamber according to the present invention, in contrast to the related art shown in FIG. 1.

It will be apparent to those skilled in the art that various modifications and variations can be made in the capacitor and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A gas heating apparatus activating reaction gases for a chemical vapor deposition, comprising:
    a chamber enclosing a heating coil;
    a heat insulating material formed on an inner surface of the chamber so as to thermally insulate the inside of the chamber from the outside;
    a quartz tube having a gas inflow pipe, a gas outflow pipe, enlarged-pipe portions having a first diameter and one or more abridged-pipe portion having a second diameter smaller than the first diameter, wherein the enlarged-pipe portions and the abridged-pipe portion are alternately repeated and constitute a zigzag shape in an up-and-down direction in the chamber;
    a plurality of ceramic balls located only inside the enlarged-pipe portions of the quartz tube; and
    said heating coil surrounding the zigzag shaped quartz tube.

2. The apparatus of claim 1, wherein the first diameter is 1 to 10 times larger than the diameter of the gas inflow and outflow pipes.

3. The apparatus of claim 1, wherein the heating coil surrounds the quartz tube in a longitudinal direction and the enlarged-pipe portions of the quartz tube are located inside the heating coil.

4. The apparatus of claim 1, wherein each abridged-pipe portion is disposed in between the enlarged-pipe portions and connects the two enlarged-pipe portions so that the enlarged-pipe portions constitute said zigzag shape.

5. The apparatus of claim 1, wherein the first diameter of the enlarged-pipe portions is sized depending on the chemical vapor deposition process.

6. The apparatus of claim 1, wherein the second diameter is excessively smaller than the first diameter.

7. The apparatus of claim 6, wherein the second diameter is equal to the diameter of the gas inflow and outflow pipes.

8. The apparatus of claim 6, wherein the second diameter is smaller than the diameter of the gas inflow and outflow pipes.

9. The apparatus of claim 6, wherein the second diameter is larger than the diameter of the gas inflow and outflow pipes.

10. The apparatus of claim 1, further comprising a coolant passage in the chamber.

11. The apparatus of claim 10, wherein a coolant flowing through the coolant passage cools down the chamber.

12. The apparatus of claim 1, wherein the enlarged-pipe portions containing the plurality of ceramic balls to receive sufficient energy to heat and activate the reaction gas from the plurality of ceramic balls.

* * * * *